United States Patent [19]

Thepault

[11] Patent Number: 4,639,059
[45] Date of Patent: Jan. 27, 1987

[54] CONNECTION DEVICE FOR ELECTRICAL COMPONENT

[75] Inventor: Claude Thepault, Milan, Italy

[73] Assignee: Crouzet S.p.A., Milan, Italy

[21] Appl. No.: 770,706

[22] Filed: Aug. 29, 1985

[30] Foreign Application Priority Data

Sep. 5, 1984 [IT] Italy ................................ 22525 A/84

[51] Int. Cl.⁴ .............................................. H01R 9/09
[52] U.S. Cl. ............................ 339/17 F; 339/176 MF
[58] Field of Search ....................... 339/176 MF, 17 F

[56] References Cited

U.S. PATENT DOCUMENTS

| | | | |
|---|---|---|---|
| 3,727,168 | 4/1973 | Henschen et al. | 339/176 MF |
| 4,141,614 | 2/1979 | Piccirillo | 339/176 MF |
| 4,143,932 | 3/1979 | Boutros | 339/17 F |
| 4,489,999 | 12/1984 | Miniet | 339/176 MF |

Primary Examiner—John McQuade
Attorney, Agent, or Firm—Karl F. Ross; Herbert Dubno

[57] ABSTRACT

The device incorporates two pre-formed bodies made of insulating material that contain a member of electrical connectors and related electrical contact points, mounted coplanar with the electrical contact points of an electromechanical component, the said contact points being connected to one another via one or more flexible printed circuits in such a way that after soldering they finish up connected to each other and rigidly attached to the said component to form a contactor that has the required connections layout.

4 Claims, 3 Drawing Figures

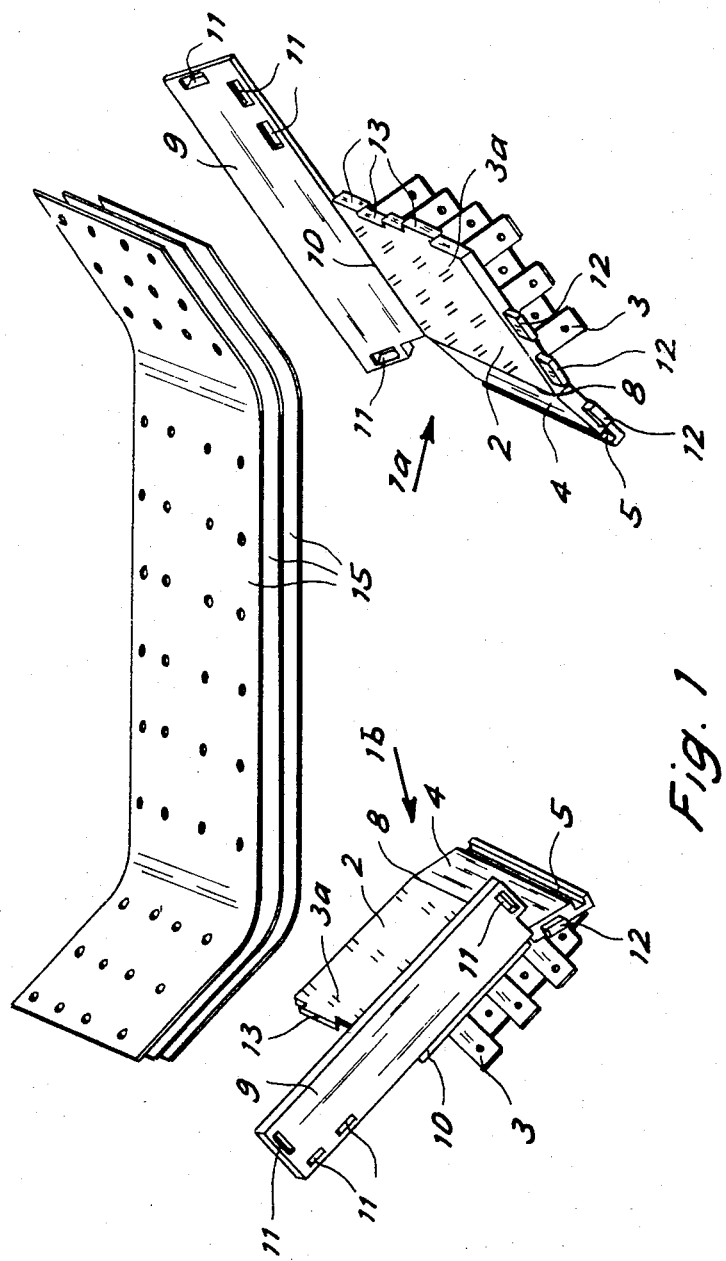

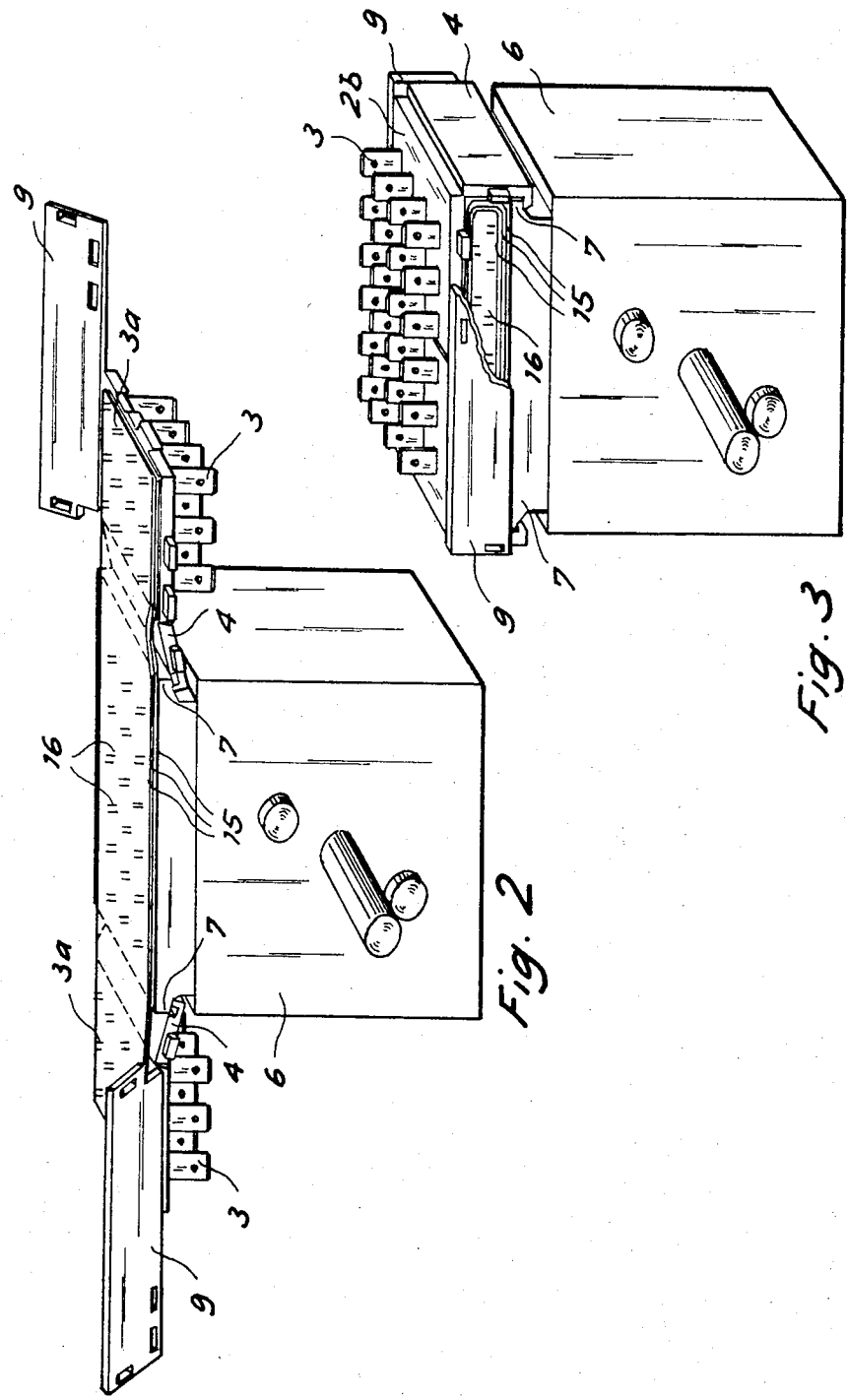

CONNECTION DEVICE FOR ELECTRICAL COMPONENT

FIELD OF THE INVENTION

The present invention relates to a connection interface structure suitable for electrical use in washing machines, dishwashers and the like.

BACKGROUND OF THE INVENTION

As is generally known, the control of the sequence of cycles in such machines is carried out by an electromechanical and/or electronic programmer which governs all the electric power and control wiring of the various parts that are electrically activated, such as motors, pumps, heating resistors and the like. The wiring is at present connected to the programmer using various types of individual connectors without any logical connections to the other circuits. The electrical outputs of the programmer are connected to its internal structure not the external circuits.

In an attempt to overcome this obstacle various types of switching systems have been proposed, for example in the automotive field, but this does not prove optimum as regards the internal wiring of the various contact points, the space occupied, weight and production costs.

Objects of the Invention

An object of the invention is to reduce or eliminate the said obstacles by producing an interface structure suitable for use in washing machines and dishwashers, which is extremely compact, reduces the amount of internal wiring required to a minimum, and makes it possible to arrange the connectors in an ordered manner, in the sense of, for example all the commands for the pump in a single. connector. One of the major purposes of the present invention is to produce a connection interface structure that is reliable and safe and which makes it possible to reduce substantially wiring faults and consequently the labour costs required to assemble the said machines.

SUMMARY OF THE INVENTION

According to the invention there is provided a connection interface device, which provides for the interconnection and arrangement of the electrical outputs of electromechanical and/or electronic components, generally referred to herein as electrical components, such as programmers and the like, comprising a pair of pre-formed bodies made of insulating material featuring a plurality of electrical connectors and related contact points, fitted to the opposing sides of the component and coplanar with the contact points of the terminals of the internal electrical circuits of the component itself, there being arranged on the said contact points of the said parts one or more flexible printed electrical circuits, in such a way that after soldering they finish up connected to each other and rigidly attached to the said electromechanical and/or electronic component to form a contactor that has the required connections layout. According to the invention, each one of the said pre-formed bodies made of insulating material is formed by several flat sections that can be connected to each other by slotting and have slotting fixtures (a slotted part) at their ends designed to provide the said rigid attachment with the other one of the bodies and with the said electromechanical and/or electronic component.

An interface device according to an embodiment of the invention is designed in such a way that the said slotting ends for the connection of the flat sections incorporate grooves into which the projections can be inserted that are present on the said electromechanical and/or electronic components, linking the latter to the said interface device so as to make it resistant to the mechanical requirements of the plugging and unplugging of the said connectors.

The design also means that the electrical connections between the said contact points of the electromechanical and/or electronic components and the said connectors are carried out using flexible printed circuits which present the central connected part to the said "contact points" and the connected extremities to the said connectors supported by the said pre-formed bodies, these printed circuits being ring-closed in the working position with the said pre-formed bodies connected to each other and with the connectors of each body, brought together to form a single contactor, and in addition these printed circuits are arranged in the assembly phase in a flat position so as to allow soldering of the connection points of the contact points and said contacts using flow soldering technology or similar automatic machines.

BRIEF DESCRIPTION OF THE DRAWING

One embodiment of an interface device according to the invention will now be described by way of example with reference to the accompanying drawing, in which:

FIG. 1 is a perspective view of the components of the device, before assembly;

FIG. 2 is a perspective view of the device assembled and still open, arranged on a programmer;

FIG. 3 is a view in partial section of an embodiment of a device according to the invention, closed and in the working position.

SPECIFIC DESCRIPTION

With reference to FIGS. 1 and 2, the device consists of two pre-formed bodies 1a and 1b, made of insulating material, conveniently of plastics, each one comprising three distinct sections but joined by flexible parts; a first, flat base section 2 with male connectors 3 each provided with integral contact points 3a; a second, end section 4 having a groove 5 able to effect a coupling with an electromechanical component 6 (FIG. 2) matching projections 7 provided at the top of the component and shaped so as to fit in the said grooves 5. The said end section 4 is attached to the first base section 2 via a strip 8, made of the same material but of smaller thickness, that forms a sort of hinge for the folding of the two sections 2 and 4 of the interface device, as illustrated in FIG. 3. A third, side section 9 is attached to the said first base section 2 via another strip 10 made of thinner material and designed to allow folding of the two sections towards one another. The section 9 is provided with several recess windows 11 into which corresponding projections 12 are slotted when the device is closed (FIG. 3), these being shaped as required on the opposing edges of the sections 2 and 4.

So as to provide better alignment and to avoid gaps created by torsion, male and female dovetail joints 13 are also provided on the edge opposite the end section 4 of each base 2 of the two pre-formed bodies 1a, 1b and designed to join with each other when the two bases 2 are in their working position.

In order to provide the electrical connection between the contact points 3a of the male connectors 3 on the bodies 1a and 1b that make up the interface device and the contact points 16 of the extremities of the internal circuits of the electromechanical component 6, printed circuits 15 of the flexible type are used, which printed circuits provide the electrical interconnections between the said contact points 16 between themselves and/or with the contact points 3a. These printed circuits 15 make it possible to create the electrical connections in a small space and with good reliability. In the example described only three layers of circuits 15 have been used, whereas this number would be increased if the interface device, with an equal number of contacts and connections, was created using a single body of the box-type, incorporating all the said male connectors on a single base instead of two separate ones, as in the example shown. The device is fitted onto the component 6 by fixing, with reference to FIG. 2, the two pre-formed bodies 1a and 1b to the end part of the component 6 by coupling the relevant parts 7 onto the grooves 5 leaving the said bodies, and 1b, in an open and flat position, aligned with the upper surface of the component 6. The printed circuits 15 are then secured to the contact points 3a and 16, according to an established electrical plan, and then the entire component 6 with the said interface device arranged flat, can be inserted into a machine for the automatic soldering of the contact points to the printed circuits, for example by a recognised flow soldering method or the like, and the relevant soldering carried out.

After this, the pre-formed bodies 1a and 1b, can be folded above the component 6 using the hinge 8, and then the side sections 9 can be folded using the hinges 10, on the two opposite sides of the component 6, so that the teeth 12 of the bodies 1a and 1b fit into the corresponding window recesses 11 of the side sections 9, and the dovetail joints 13, at the ends of the base sections 2 of each body 1a and 1b, are fitted together.

The device as described, has a form, when closed, that is basically a parallelopiped that takes up small space, and from which only the male connectors 3 project. It can be arranged according to the specific requirements of position, consumption, function etc. On the upper surface 2b of the first body 2, it is also possible to provide suitable recesses, projections etc. (not shown in the figures) designed to make certain areas asymmetrical, including similar connectors, thereby producing a preferential positioning that enables the frequent faults encountered when inserting individual connectors to be avoided.

The said side and end sections 4, 9 with the respective teeth 12, with window recesses 11, as well as the slotted parts 13 make it possible for the invention to provide a support structure which when in the working position is designed to endure the loads and pressures created by the plugging and unplugging of the female connectors without any chance contacts occurring between the contact points 3a and 16 that face each other.

Fitting the interface device to the electromechanical and/or electronic components as described also makes it possible to group all or some of the male connectors in a way that allows separate construction of the relative wiring with female terminal connectors already fitted, so as to reduce production costs and eliminate the possibility of errors when connecting the component with the various equipment that it controls.

It is intended that for each electromechanical or electronic component to which this interface device according to the invention is to be fitted, the dimensions and shape of the pre-formed bodies and the printed circuits are adapted to the particular requirements and shapes of each component, without having to go beyond the scope of the present invention when doing so.

I claim:

1. A connection interface between an electrical component and other electrical circuit elements, comprising:

means forming a plurality of contact points on a side of said component;

at least one flexible printed circuit board affixed intermediate its length to said side of said component and electrically connected to said contact points in accordance with a selected connection arrangement, said printed circuit board having ends extending beyond said component on opposite sides thereof;

a respective flat preformed rigid body mounted on each of said ends and electrically connected to said printed circuit board along one side of each of said bodies in accordance with a selected connection arrangement, an opposite side of each preformed body being formed with terminals connectable to said elements, said bodies being foldable over said side of said component provided with said contact points whereby said preformed bodies are generally in a coplanar relationship and said terminals project away from said component;

a slotted part hingedly connected to each of said bodies and receiving a ridge formed in said component adjacent the side provided with said contact points to enable said bodies to fold to overlie said side provided with said contact points; and means for retaining said bodies in said coplanar relationship.

2. The connection interface defined in claim 1 wherein said means for retaining said bodies in coplanar relationship includes a respective flap swingably mounted on an edge of each body and provided with recesses adapted to receive formations along an edge of the other of said bodies.

3. The connection interface defined in claim 2 wherein each of said flaps has a recess adapted to receive a formation on the slotted part of the other body.

4. The connection interface defined in claim 1 wherein said bodies and said contact points lie in a plane prior to swinging said bodies into said coplanar relationship for soldering said contact points of said component and contact points of said terminals to said printed circuit board.

* * * * *